(12) United States Patent
Bai et al.

(10) Patent No.: US 11,457,541 B2
(45) Date of Patent: Sep. 27, 2022

(54) INTELLIGENT LUG

(71) Applicant: New H3C Technologies Co., Ltd., Zhejiang (CN)

(72) Inventors: Youxin Bai, Beijing (CN); Yan Qiao, Beijing (CN); Jianming Ding, Beijing (CN); Yi Li, Beijing (CN); Hui Tian, Beijing (CN); Chunxi Yan, Beijing (CN)

(73) Assignee: New H3C Technologies Co., Ltd., Zhejiang (CN)

( * ) Notice: Subject to any disclaimer, the term of this patent is extended or adjusted under 35 U.S.C. 154(b) by 0 days.

(21) Appl. No.: 17/277,601

(22) PCT Filed: Nov. 18, 2019

(86) PCT No.: PCT/CN2019/119140
§ 371 (c)(1),
(2) Date: Mar. 18, 2021

(87) PCT Pub. No.: WO2020/119397
PCT Pub. Date: Jun. 18, 2020

(65) Prior Publication Data
US 2021/0360817 A1 Nov. 18, 2021

(30) Foreign Application Priority Data
Dec. 12, 2018 (CN) .......................... 201811521112.6

(51) Int. Cl.
*H05K 7/14* (2006.01)
(52) U.S. Cl.
CPC ......... *H05K 7/1498* (2013.01); *H05K 7/1492* (2013.01)
(58) Field of Classification Search
CPC ................ H05K 7/1498; H05K 7/1492; G06F 2213/0052
(Continued)

(56) References Cited

U.S. PATENT DOCUMENTS 7,844,702 B1 * 11/2010 Manczak ............. H05K 7/1498
705/28
7,857,214 B2 * 12/2010 Saliaris ................ H05K 7/1498
235/383

(Continued)

FOREIGN PATENT DOCUMENTS

CN 101329556 A 12/2008
CN 102122156 A 7/2011
(Continued)

OTHER PUBLICATIONS

International Search Report dated Jan. 17, 2020, issued in connection with International Application No. PCT/CN2019/119140, filed on Nov. 18, 2019, 5 pages.

(Continued)

*Primary Examiner* — Adrian S Wilson
*Assistant Examiner* — Gage Crum
(74) *Attorney, Agent, or Firm* — McDonnell Boehnen Hulbert & Berghoff LLP (57) ABSTRACT

Examples of the disclosure provide a smart angled mounting piece and an angled mounting piece assembly. By providing switching units and identification circuits in the smart angled mounting piece, when one or more of the switching units are triggered by the auxiliary member, an identification circuit electrically connected to the triggered switching unit and an identification circuit electrically connected to a switching unit that is not triggered collectively generate a logic signal characterizing the position at which the electronic device is installed to the cabinet, and the logic signal is transmitted to the electronic device through the communication module. The manager may know the position of the current electronic device in real time, without the need to specifically provide position acquisition elements on the cabinet, and without the need to install a separate management system on (Continued)

the back-end server, simplifying the difficulty of device management.

8 Claims, 4 Drawing Sheets

(58) Field of Classification Search
 USPC .................................................. 361/679.01
 See application file for complete search history.

(56) References Cited

U.S. PATENT DOCUMENTS

| | | |
|---|---|---|
| 2006/0220872 A1 | 10/2006 | Brown et al. |
| 2009/0108995 A1* | 4/2009 | Tucker ................. H05K 7/1498 340/572.7 |
| 2011/0162399 A1 | 7/2011 | Oturak et al. |
| 2011/0187503 A1* | 8/2011 | Costa ................... H05K 7/1498 340/8.1 |
| 2011/0271020 A1* | 11/2011 | Wilson ................. H05K 7/1498 710/104 |
| 2012/0185579 A1 | 7/2012 | Watanabe |
| 2014/0297855 A1 | 10/2014 | Moore |
| 2018/0262722 A1 | 9/2018 | Li |

FOREIGN PATENT DOCUMENTS

| | | |
|---|---|---|
| CN | 102149996 A | 8/2011 |
| CN | 102313506 A | 1/2012 |
| CN | 102609743 A | 7/2012 |
| CN | 102812411 A | 12/2012 |
| CN | 202887166 U | 4/2013 |
| CN | 104053321 A | 9/2014 |
| CN | 203894791 U | 10/2014 |
| CN | 106900160 A | 6/2017 |
| CN | 207075153 U | 3/2018 |
| JP | S6017729 A | 1/1985 |
| JP | 2002366505 A | 12/2002 |
| JP | 2009283368 A | 12/2009 |
| JP | 2010098399 A | 4/2010 |
| JP | 2011164826 A | 8/2011 |
| JP | 5455234 B2 | 3/2014 |
| JP | 2014067326 A | 4/2014 |
| JP | 2018152043 A | 9/2018 |

OTHER PUBLICATIONS

Written Opinion dated Jan. 17, 2020, issued in connection with International Application No. PCT/CN2019/119140, filed on Nov. 18, 2019, 3 pages.

* cited by examiner

INTELLIGENT LUG

CROSS-REFERENCE TO RELATED APPLICATIONS

The present application is a U.S. National Phase Application under 35 U.S.C. § 371 of International Application No. PCT/CN2019/119140 filed Nov. 18, 2019, which claims priority to Chinese Patent Application No. 201811521112.6, filed with the China National Intellectual Property Administration on Dec. 12, 2018 and entitled "An intelligent lug and a lug assembly", which are incorporated into the disclosure by reference in their entirety.

BACKGROUND

Electronic devices are typically placed in cabinets (also called racks) in a data center computer room. It is often necessary to configure multiple identical electronic devices in the same cabinet. For example, multiple electronic devices are installed to multiple installation regions of a cabinet. It is necessary for the administrator to know where each electronic device is specifically installed, so that it is easy to find and trace back each electronic device.

BRIEF DESCRIPTION OF THE DRAWINGS

In order to more clearly describe the technical solutions of examples of the disclosure and the prior art, drawings that need to be used in examples of the disclosure and the prior art will be briefly described below. Obviously, the drawings described below are for only some examples of the disclosure; those skilled in the art may also obtain other drawings based on these drawings without any creative efforts.

Reference signs: 100-smart angled mounting piece; 200-electronic device; 300-cabinet; 400-auxiliary member; 110-angled mounting piece body; 112-attachment portion; 114-fixing hole; 116-screw; 130-position identification unit; 134-identification circuit; 136-communication module; 1321-first through hole; 1322-clip; 1323-first protrusion; 420-first triggering region; 422-first triggering structure; 424-second through hole; 426-trigger point; 428-second protrusion; 430-installation plate; 432-installation hole.

DETAILED DESCRIPTION

In order to make the objectives, technical solutions, and advantages of examples of the disclosure clearer and more understandable, examples of the disclosure will be described in more detail below with reference to the drawings and examples. Obviously, the described examples are only some, and not all, of the examples of the disclosure. All other examples obtained by those skilled in the art based on the examples of the disclosure without creative efforts shall fall within the scope of protection of the disclosure.

In the conventional technology, when recording the position information of an electronic device in a cabinet, an administrator needs to install a pair of infrared receiver and an infrared transmitter in each of installation regions of the cabinet, and the administrator also needs to install a separate management system in a back-end server, which brings more troubles to the management of electronic devices.

Examples of the disclosure provide a smart angled mounting piece and an angled mounting piece assembly to reduce management troubles when recording position information of electronic devices in a cabinet.

Example

Figure 1:
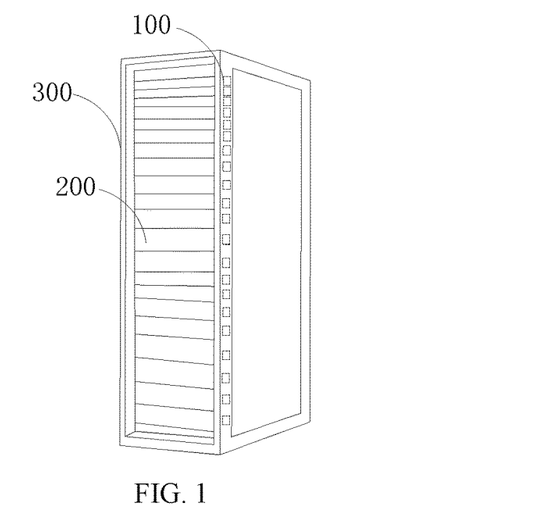
FIG. 1 is a schematic structural diagram of installation of an electronic device in a cabinet provided by an example of the disclosure.
Figure 2:
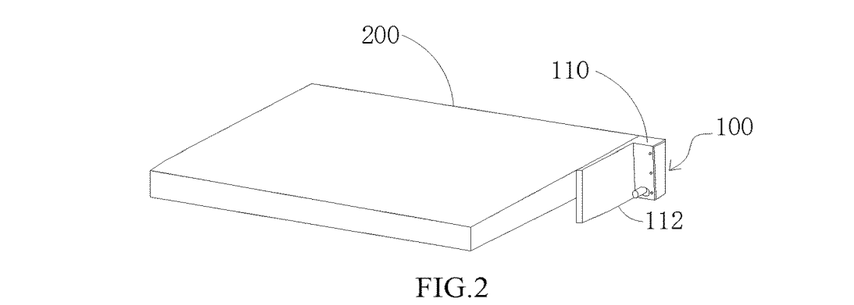
FIG. 2 is a schematic diagram of assembly of a smart angled mounting piece with an electronic device provided by an example of the disclosure.

Referring to FIG. 1 and FIG. 2 together, an example of the disclosure provides a smart angled mounting piece 100. The smart angled mounting piece 100 is configured to interconnect with an electronic device 200, and the electronic device 200 is installed on a cabinet 300. In the example of the disclosure, the electronic device 200 may be a switch, a router, or the like.

Figure 3:
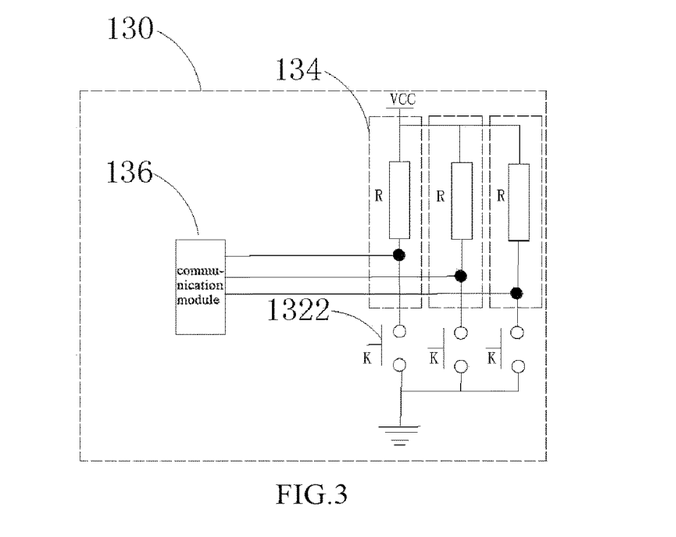
FIG. 3 is a circuit diagram of a position identification unit of the smart angled mounting piece shown in FIG. 2.

Referring to FIG. 2 and FIG. 3 together, the smart angled mounting piece 100 includes a angled mounting piece body 110 and a position identification unit 130. In the example of the disclosure, a side of the angled mounting piece body 110 is provided with an attachment portion 112, and the smart angled mounting piece 100 may be attached to a side of the electronic device 200 by the attachment portion 112. For example, the attachment portion 112 can be installed on one side of the electronic device 200 by clamping, screwing, pasting, or the like. The position identification unit 130 is installed on the angled mounting piece body 110. In the example of the disclosure, the angled mounting piece body 110 is a hollow structure, and the position identification unit 130 is accommodated within the angled mounting piece body 110.

Referring to FIG. 3, the position identification unit 130 includes at least one switching unit (not labeled), at least one identification circuit 134 and a communication module 136; wherein each identification circuit 134 is electrically connected to each switching unit in one-to-one correspondence. There may be two, three, four or more switching units and identification circuits 134. In the example of the disclosure, three switching units and three identification circuits 134 are taken as an example for illustration.

As shown in FIG. 3, each of the identification circuits 134 in the example of the disclosure includes a pull-up resistor. The pull-up resistor and the switching unit are connected in series between the power source and the ground. One end of the communication module 136 is electrically connected between each of the pull-up resistors and the switching unit electrically connected to the pull-up resistor. In other examples of the disclosure, each of the identification circuits 134 includes a pull-down resistor, and the pull-down resistor and the switching unit are connected in series between the ground and the power source. One end of the communication module 136 is electrically connected between each pull-down resistor and the switching unit electrically connected to the pull-down resistor.

Figure 4:
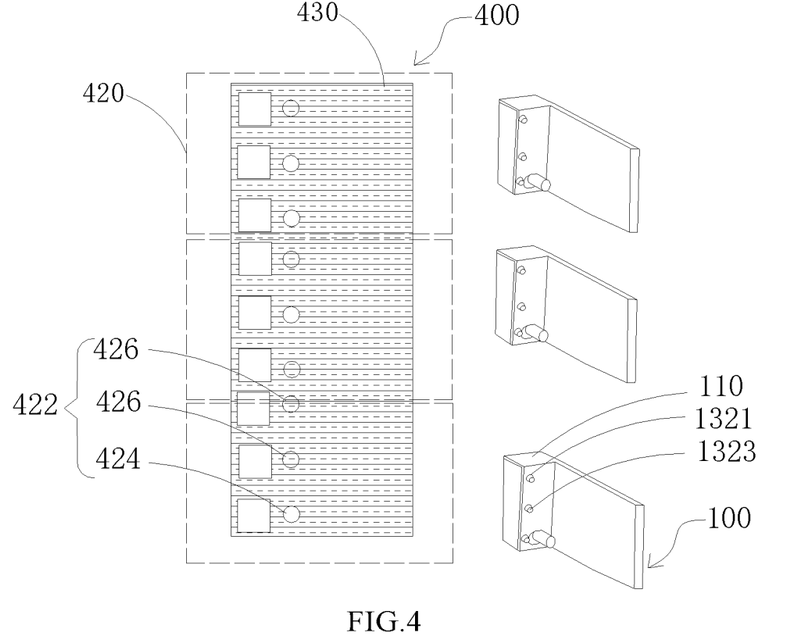
FIG. 4 is a schematic structural diagram of a first implementation of a smart angled mounting piece and an auxiliary member provided by an example of the disclosure.

Referring to FIG. 3 and FIG. 4 together, the switching unit is configured to be triggered when being pressed against by an auxiliary member 400 (described in detail later) installed on the cabinet 300, and the identification circuit 134 is configured to generate a logic signal when the switching unit is triggered. When one or more switching units are triggered by the auxiliary member 400, an identification circuit 134 electrically connected to the triggered switching unit and an identification circuit 134 electrically connected to a switching unit that is not triggered collectively generate a logic signal. The logic signal is configured to characterize the position at which the electronic device 200 is installed to the cabinet 300. The communication module 136 is configured to receive the logic signal generated by identification circuits 134 and output the logic signal to the electronic device 200.

In the example of the disclosure, the smart angled mounting piece 100 is communicatively connected to the electronic device 200 through the communication module 136, including but not limited to a communication cable wired connection, a Bluetooth module wireless connection, or a WIFI module wireless connection.

As one implementation, each of the switching units may include a first through hole 1321, a clip 1322 and a first protrusion 1323. The first through hole 1321 is provided on the angled mounting piece body 110, and the first protrusion 1323 is slidably provided within the first through hole 1321 and aligned with the position of the clip 1322.

The first protrusion 1323 is configured to push the clip 1322 when being pressed against by the auxiliary member 400, such that the clip 1322 is in contact with and electrically connected to the identification circuit 134. As such, the pull-up resistor is grounded such that the identification circuit 134 generates a low-level signal.

For example, when the position identification unit 130 includes three switching units and three identification circuits 134, three first through holes 1321 are provided and spaced apart on a side of the angled mounting piece body 110 in the vertical direction. Each of the first protrusions 1323 is slidably provided within a first through hole 1321 and aligned with the position of a clip 1322.

Referring to FIG. 4, the auxiliary member 400 is provided with multiple triggering regions 420 in the vertical direction, wherein the triggering region 420 is configured for corresponding to the position of an electronic device 200 and for pressing against the switching units to trigger the switching units.

Each of the triggering regions 420 includes a first triggering structure 422, and the number of first triggering structures 422 is the same as the number of the switching units. The first triggering structures 422 may be formed as a second through hole(s) 424 and a trigger point(s) 426, or formed as a second through hole(s) 424 or formed as a trigger point(s) 426. In other words, the sum of the number of the second through holes 424 and the number of the trigger points 426 is the same as the number of the switching units.

In the example of the disclosure, the first triggering structures 422 include a second through hole 424 and two trigger points 426, and the second through hole 424 is located below the two trigger points 426. When the smart angled mounting piece 100 cooperates with the auxiliary member 400, the first protrusion 1323 passes through the second through hole 424, so that the clip 1322 cannot be pushed and thus the switching unit is not triggered. At this time, the clip 1322 is not in contact with the identification circuit 134, and the pull-up resistor corresponding to the switching unit generates a high-level signal. Contrarily, the first protrusion 1323 is pressed against by a trigger point 426, and thereby slides in the first through hole 1321 to push the clip 1322, and thus the switching unit is triggered. At this time, the clip 1322 is in contact with and electrically connected to the identification circuit 134, and the pull-up resistor corresponding to the switching unit is grounded and generates a low-level signal.

In the disclosed example, it is provided that the high-level signal is indicated by a logical number 1 and the low-level signal is indicated by a logical number 0. When the switching units cooperate with the first triggering structures 422 (the second through hole 424 is located below the two trigger points 426), the identification circuits 134 electrically connected to the triggered switching units and the identification circuit 134 electrically connected to the switching unit that is not triggered collectively generate a logic signal 001. It can be understood that when the second through hole 424 is located between the two trigger points 426, the identification circuits 134 electrically connected to the triggered switching units and the identification circuit 134 electrically connected to the switching unit that is not triggered collectively generate a logic signal 010. When two second through holes 424 are located below a trigger point 426, the identification circuit 134 electrically connected to the triggered switching unit and the identification circuits 134 electrically connected to the switching units that are not triggered collectively generate a logic signal 011.

The above logic signals 001, 010 and 011 may all be configured to characterize the position of the electronic device 200. For example, 001 indicates that the electronic device 200 is located in the first layer installation region of the cabinet 300, 010 indicates that the electronic device 200 is located in the second layer installation region of the cabinet 300, and 011 indicates that the electronic device 200 is located in the third layer installation region of the cabinet 300. It can be understood that by increasing the triggering regions 420, the logic signals collectively generated by all the identification circuits 134 may characterize the installation regions of the eight electronic devices 200 with respect to the cabinet 300.

Figure 5:
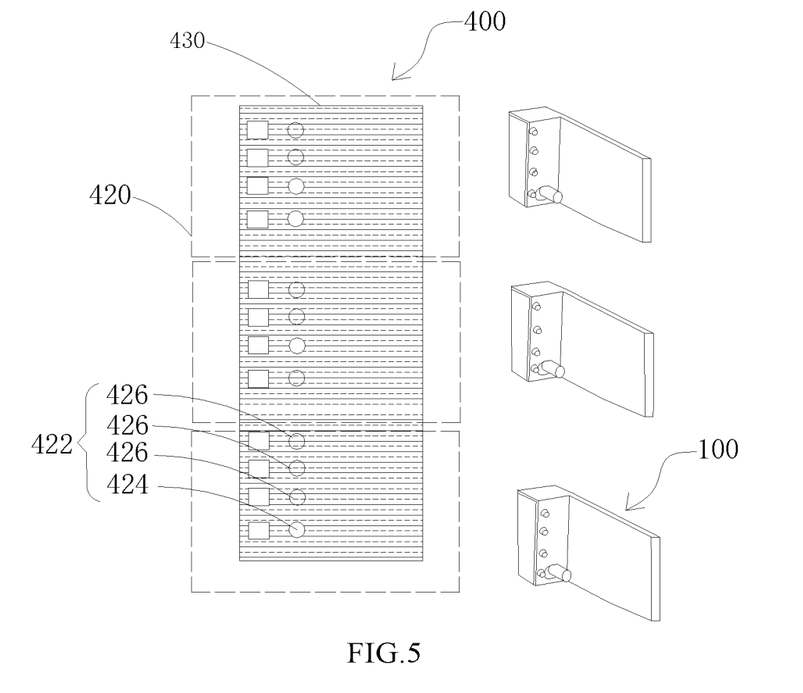
FIG. 5 is a schematic structural diagram of a second implementation of a smart angled mounting piece and an auxiliary member provided by an example of the disclosure.

The above examples are merely illustrative. When in application, the number of the switching units and the number of the identification circuits 134 may be increased or decreased based on actual conditions. For example, referring to FIG. 5, when there are four switching units and four identification circuits 134, the total number of the first triggering structures 422, i.e. the total number of the second through holes 424 and the trigger points 426 can also be set to four. As such, in a possible situation, the four identification circuits 134 may collectively output logic signals 0001, 0010, 0011 and 0100. It can be understood that by increasing the triggering regions 420, the logic signals collectively generated by all the identification circuits 134 may characterize the installation regions of the sixteen electronic devices 200 with respect to the cabinet 300.

The case of the above switching units and auxiliary member 400 is an implementation of the disclosure. As another implementation, referring to FIG. 6 and FIG. 7, each switching unit includes a first through hole 1321 and a clip 1322 (referring to FIG. 3). The first through hole 1321 is provided in the angled mounting piece body 110, and the clip 1322 is aligned with the position of the first through hole 1321.

Figure 6:
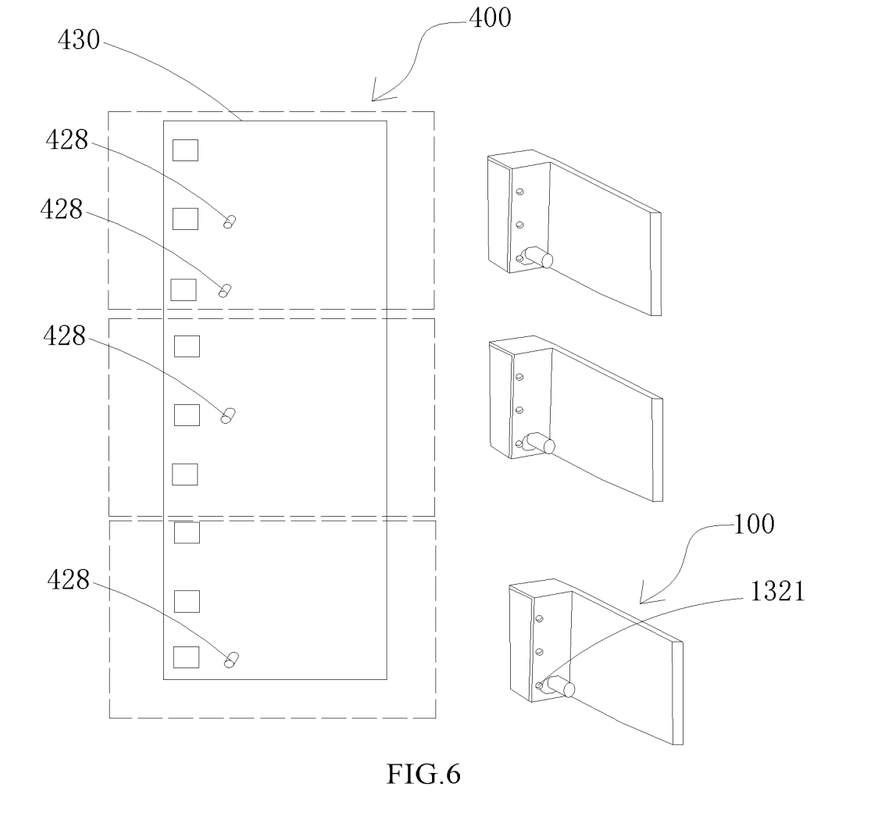
FIG. 6 is a schematic structural diagram of a third implementation of a smart angled mounting piece and an auxiliary member provided by an example of the disclosure.
Figure 7:
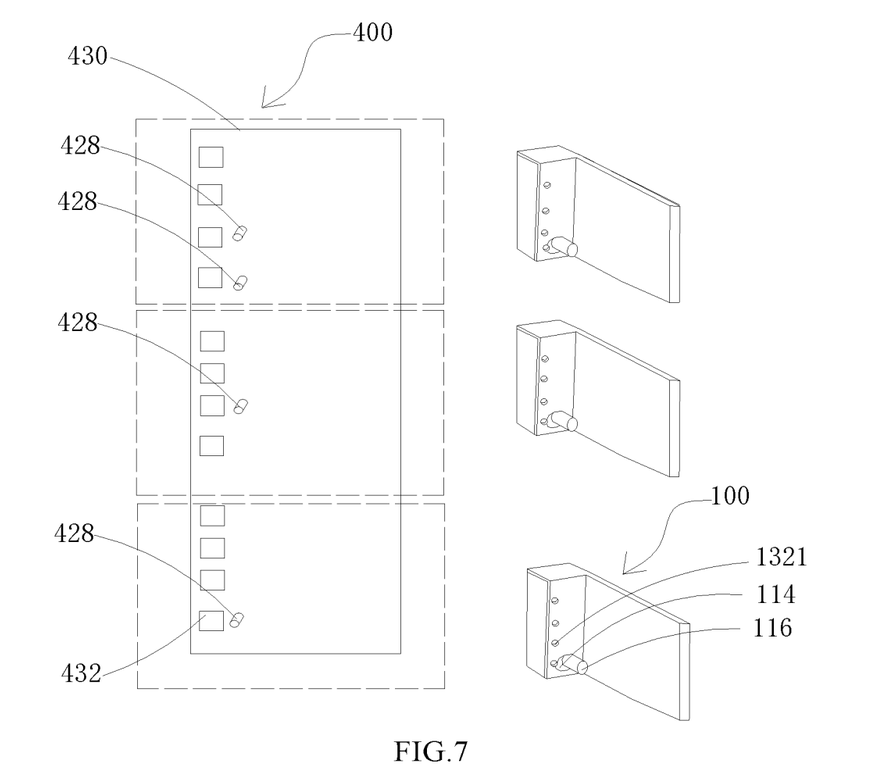
FIG. 7 is a schematic structural diagram of a fourth implementation of a smart angled mounting piece and an auxiliary member provided by an example of the disclosure.

The clip 1322 is configured to, when being triggered by the auxiliary member 400 passing through the first through hole 1321, contact with and be electrically connected to the identification circuit 134. As such, the pull-up resistor is grounded such that the identification circuit 134 generates a low-level signal. On the contrary, when the clip 1322 is not triggered by the auxiliary member 400, the clip 1322 is not in contact with the identification circuit 134, and the identification circuit 134 corresponding to the switching unit generates a high-level signal.

For example, when the position identification unit 130 includes three switching units and three identification circuits 134, three first through holes 1321 are provided and spaced apart on a side of the angled mounting piece body 110 in the vertical direction.

Referring to FIG. 6, the auxiliary member 400 is provided with multiple triggering regions 420 in the vertical direction, wherein the triggering region 420 is configured for corresponding to the position of an electronic device 200 and for pressing against the switching units to trigger the switching units.

Each of the triggering regions 420 includes a second triggering structure. In the example of the disclosure, the second triggering structure may include a second protrusion 428.

In an example of the disclosure, the second triggering structure includes one second protrusion 428. When the smart angled mounting piece 100 cooperates with the auxiliary member 400, the second protrusion 428 passes through the first through hole 1321, so that the second protrusion 428 slides in the first through hole 1321 to push the clip 1322 and so as to trigger the switching unit. At this time, the clip 1322 is in contact with the identification circuit 134, and the pull-up resistor corresponding to the switching unit generates a low-level signal. On the contrary, when the second protrusion 428 does not pass through the first through hole 1321, the clip 1322 does not contact with the identification circuit 134, and the pull-up resistor corresponding to the switching unit generates a high-level signal.

In the disclosed example, it is provided that the high-level signal is indicated by a logical number 0 and the low-level signal is indicated by a logical number 1.

When there are three switching units, three preset regions may be provided on the triggering region 420 from top to bottom, and these preset regions are used to install the second protrusion 428. If there is only one second protrusion 428 that is located in a lower preset region in the triggering region 420, the identification circuit 134 electrically connected to the triggered switching unit and the identification circuits 134 electrically connected to the switching units that are not triggered collectively generate a logic signal 001. If there is only one second protrusion 428 that is located in a preset region in the middle of the triggering region 420, the identification circuit 134 electrically connected to the triggered switching unit and the identification circuits 134 electrically connected to the switching units that are not triggered collectively generate a logic signal 010. If there are two second protrusions 428 that are located in two lower preset regions in the triggering region 420, the identification circuits 134 electrically connected to the triggered switching units and the identification circuit 134 electrically connected to the switching unit that is not triggered collectively generate a logic signal 011.

The above logic signals 001, 010 and 011 may all be used to characterize the position of the electronic device 200. For example, 001 indicates that the electronic device 200 is located in the first layer installation region of the cabinet 300, 010 indicates that the electronic device 200 is located in the second layer installation region of the cabinet 300, and 011 indicates that the electronic device 200 is located in the third layer installation region of the cabinet 300. It can be understood that by increasing the triggering regions 420, the logic signals collectively generated by all the identification circuits 134 may characterize the installation regions of the eight electronic devices 200 with respect to the cabinet 300.

The above examples are merely illustrative. When in application, the number of the switching units and the number of the identification circuits 134 may be increased or decreased based on actual conditions. For example, referring to FIG. 7, when there are four switching units and four identification circuits 134, by configuring the preset regions where the second protrusions 428 are located and the number of the second protrusions 428, in one possible situation, the four identification circuits 134 may collectively output logic signals 0001, 0010, 0011 and 0100. It can be understood that by increasing the triggering regions 420, the logic signals collectively generated by all the identification circuits 134 may characterize the installation regions of the sixteen electronic devices 200 with respect to the cabinet 300.

Referring to FIG. 7 again, the angled mounting piece body 110 is further provided with a fixing hole 114 for being passed through by a screw 116. When in application, the screw 116 may pass through the fixing hole 114 to attach the angled mounting piece body 110 to the auxiliary member 400 to finally achieve the purpose of stably fixing the smart angled mounting piece 100 to the cabinet 300 through the auxiliary member 400.

When the smart angled mounting piece 100 is used, the smart angled mounting piece 100 is attached to a side of the electronic device 200 by the attachment portion 112 of the smart angled mounting piece 100, and the auxiliary member 400 is installed to the cabinet 300. The smart angled mounting piece 100 is then fixed to the auxiliary member 400 to install the electronic device 200 to the installation region of the cabinet 300.

When one or more switching units are triggered by the auxiliary member 400, multiple identification circuits 134 collectively generate a logic signal. The communication module 136 outputs the logic signal to the electronic device 200 so that the technicians may know in time the position at which the electronic device 200 is installed in the cabinet 300. In this way, it is not necessary to specifically provide position acquisition elements on the cabinet 300, and it is also not necessary to install a separate management system in the back-end server, and thus it is convenient for deployment and management, and the management accuracy is improved and the manpower is saved.

An example of the disclosure further provides an angled mounting piece assembly (not shown), which includes the smart angled mounting piece 100 and the auxiliary member 400 described in the above examples. The basic principle and the technical effects of the smart angled mounting piece 100 provided by this example of the disclosure are the same as those of the above examples, and for a brief description, what is not mentioned in this example of the disclosure may refer to the corresponding contents in the above examples.

In the example of the disclosure, the auxiliary member 400 is detachably connected to the cabinet 300 or is a part of the cabinet 300. The design of the auxiliary member 400 is not limited herein. Referring to FIG. 7 again, an installation hole 432 for being passed through by the screw 116 of the smart angled mounting piece 100 is further provided in the extension direction of the auxiliary member 400 to facilitate the passage of the screw 116 through the installation hole 432, thereby stably fixing the smart angled mounting piece 100 to the cabinet 300 through the auxiliary member 400.

Referring to FIG. 4 to FIG. 7, as an implementation, the auxiliary member 400 may include only one installation plate 430. As such, one above smart angled mounting piece 100 is attached to a side of the electronic device 200.

The above multiple triggering regions 420 are provided on the installation plate 430. When a switching unit of the smart angled mounting piece 100 is triggered by being pressed against by a triggering region 400 of the installation plate 430 installed on the cabinet 300, the identification circuit 134 electrically connected to the triggered switching unit and the identification circuit 134 electrically connected to a switching unit that is not triggered collectively a generate logic signal.

Figure 8:
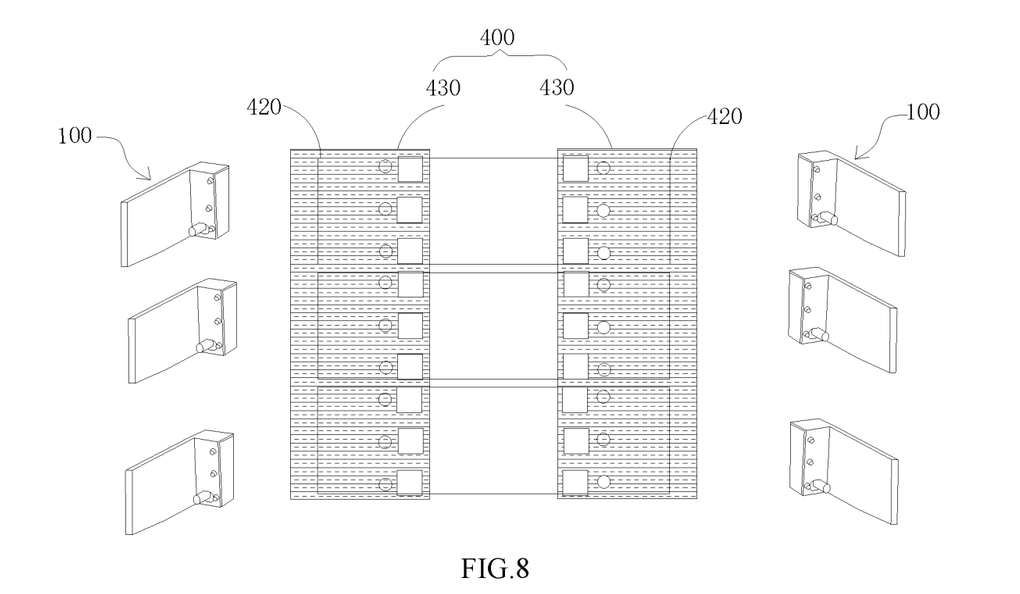
FIG. 8 is a schematic structural diagram of a fifth implementation of a smart angled mounting piece and an auxiliary member provided by an example of the disclosure.

In addition, as another implementation, as shown in FIG. 8, the angled mounting piece assembly may include an auxiliary member 400 and two above smart angled mounting pieces 100; wherein the auxiliary member 400 includes two above installation plates 430. During the installation, the two smart angled mounting pieces 100 are respectively installed on two sides of the electronic device 200, and the two installation plates 430 are respectively installed on two sides of the cabinet 300 and are oppositely installed, so that each smart angled mounting piece 100 corresponds to one installation plate 430. Each smart angled mounting piece 100 is installed to a triggering region 420 of an installation plate 430. Switching units of each angled mounting piece 100 are triggered when being pressed against by a triggering region 420 of an installation plate 430 installed on the cabinet 300. Identification circuits 134 of each smart angled mounting piece 100 generate a logic signal when the switching units are triggered. Two logic signals of the two smart angled mounting pieces 100 collectively characterize the position at which the electronic device 200 is installed to the cabinet 300.

In the example of the disclosure, the smart angled mounting piece 100 located on the left side of the electronic device 200, when being triggered by the auxiliary member 400 located on the left side of the cabinet 300, outputs a first logic signal, and the smart angled mounting piece 100 located on the right side of the electronic device 200, when being triggered by the auxiliary member 400 located on the right side of the cabinet 300, outputs a second logic signal. The first logic signal and the second logic signal collectively characterize the position at which the electronic device 200 is installed to the cabinet 300. For example, the smart angled mounting piece 100 located on the left side of the electronic device 200, when being triggered by the auxiliary member 400 located on the left side of the cabinet 300, outputs a first logic signal 000, and the smart angled mounting piece 100 located on the right side of the electronic device 200, when being triggered by the auxiliary member 400 located on the right side of the cabinet 300, outputs a second logic signal 001, therefore the logic signal characterizing the position at which the electronic device 200 is installed to the cabinet 300 is 000001.

In this manner, installation regions of a greater number of electronic devices 200 relative to the cabinet 300 may be characterized. Examples of the disclosure may identify the positions of 64 electronic devices 200.

In summary, the smart angled mounting piece and angled mounting piece assembly provided by the examples of the disclosure have the beneficial effects of: by providing switching units and identification circuits in the smart angled mounting piece, when one or more of the switching units are triggered by the auxiliary member, an identification circuit electrically connected to the triggered switching unit and an identification circuit electrically connected to the switching unit that is not triggered collectively generate a logic signal characterizing the position at which the electronic device is installed to the cabinet. The logic signal may be transmitted to the electronic device through the communication module, so that the manager can know the position of the current electronic device in real time, without the need to specifically provide position acquisition elements on the cabinet, and without the need to install a separate management system on the back-end server. The provided smart angled mounting piece and angled mounting piece assembly facilitate the deployment and management of the electronic device, improve the management accuracy, save the manpower, and are advantageous for being uniformly used by different device manufacturers, which simplifies the difficulty of device management.

The above examples are simply preferable examples of the disclosure, and are not intended to limit the scope of protection of the disclosure. Any modifications, alternatives, improvements, or the like within the spirit and principle of the disclosure shall be included within the scope of protection of the disclosure.

The invention claimed is:

1. A smart angled mounting piece, interconnected with an electronic device installed in a cabinet; wherein, the smart angled mounting piece comprises an angled mounting piece body and a position identification unit; the position identification unit is installed on the angled mounting piece body; the position identification unit comprises a communication module, more than one switching unit and more than one identification circuit; and each of identification circuits is electrically connected to each of switching units in one-to-one correspondence;

the switching unit is triggered when being pressed against by an auxiliary member installed on the cabinet; when one or more switching units of the switching units are triggered by the auxiliary member, one or more of the identification circuits electrically connected to the one or more switching units triggered and the remaining one or more identification circuits electrically connected to a switching unit that are not triggered collectively generate a logic signal characterizing a position at which the electronic device is installed to the cabinet, and transmit the logic signal to the communication module;

the communication module is configured to receive the logic signal and output the logic signal to the electronic device, wherein, each of the switching units comprises a first through hole, a clip and a first protrusion; the first through hole is provided in the angled mounting piece body, and the first protrusion is slidably provided within the first through hole and aligned with the position of the clip;

the first protrusion is configured to push the clip when being pressed against by the auxiliary member, such that the clip is in contact with and electrically connected to a corresponding identification circuit of the identification circuits.

2. The smart angled mounting piece of the claim 1, wherein, each of the identification circuits comprises a pull-up resistor, and each pull-up resistor and a corresponding switching unit of the switching units are connected in series between a power source and a ground;

one end of the communication module is electrically connected between each pull-up resistor and the corresponding switching unit.

3. The smart angled mounting piece of the claim 1, wherein, each of the identification circuits comprises a pull-down resistor, and each pull-down resistor and a corresponding switching unit of the switching units are connected in series between a ground and a power source;
one end of the communication module is electrically connected between each pull-down resistor and the corresponding switching unit a.

4. The smart angled mounting piece of the claim 1, wherein, each of the switching units comprises a first through hole and a clip; the clip is aligned with the position of the first through hole;
the clip is configured to be pressed against when the auxiliary member passes through the first through hole, such that the clip is in contact with and electrically connected to a corresponding identification circuit of the identification circuits.

5. An angled mounting piece assembly, comprising a smart angled mounting piece and an auxiliary member; wherein, the smart angled mounting piece is interconnected with an electronic device installed in a cabinet; the auxiliary member is provided on the cabinet;
the smart angled mounting piece comprises an angled mounting piece body and a position identification unit; the position identification unit is installed on the angled mounting piece body;
the position identification unit comprises a communication module, more than one switching unit and more than one identification circuit; and each of identification circuits is electrically connected to each of switching units in one-to-one correspondence;
the switching unit is triggered when being pressed against by the auxiliary member; when one or more switching units of the switching units are triggered by the auxiliary member, one or more of the identification circuits electrically connected to the one or more switching units triggered and the remaining one or more identification circuits electrically connected to a switching unit that are not triggered collectively generate a logic signal characterizing a position at which the electronic device is installed to the cabinet, and transmit the logic signal to the communication module;
the communication module is configured to receive the logic signal and output the logic signal to the electronic device,
wherein, each of the switching units comprises a first through hole, a clip and a first protrusion; the first through hole is provided in the angled mounting piece body, and the first protrusion is slidably provided within the first through hole and aligned with the position of the clip;
a triggering region is configured to correspond to a position of one electronic device;
the triggering region comprises a first triggering structure; wherein, the number of first triggering structures is the same as the number of the switching units; the first triggering structures are formed as a second through hole and a trigger point respectively, or formed as the second through holes or formed as the trigger points;
the sum of the number of second through holes and the number of trigger points is the same as the number of the switching units;
the second through hole is configured to be passed through by the first protrusion, and the trigger point is configured to press against the first protrusion;
the first protrusion is configured to, when being pressed against by the trigger point, slide in the first through hole to push the clip, such that the clip is in contact with and electrically connected to the identification circuit.

6. The angled mounting piece assembly of claim 5, wherein, the auxiliary member comprises an installation plate; the installation plate comprises the triggering region;
the triggering region is configured to press against the switching unit to trigger the switching unit.

7. The angled mounting piece assembly of the claim 6, wherein, each of the switching units comprises a first through hole and a clip; the clip is aligned with the position of the first through hole;
the triggering region is configured to correspond to a position of one electronic device; the triggering region comprises a second triggering structure;
the second triggering structure is provided with a second protrusion; the second protrusion is configured to be inserted into the first through hole to push the clip; the clip is configured to, when being pushed by the second protrusion, be in contact with and electrically connected to the identification circuit.

8. The angled mounting piece assembly of claim 5, wherein, the auxiliary member is detachably connected to the cabinet or is a part of the cabinet.

* * * * *

UNITED STATES PATENT AND TRADEMARK OFFICE
CERTIFICATE OF CORRECTION

| | |
|---|---|
| PATENT NO. | : 11,457,541 B2 |
| APPLICATION NO. | : 17/277601 |
| DATED | : September 27, 2022 |
| INVENTOR(S) | : Youxin Bai et al. |

It is certified that error appears in the above-identified patent and that said Letters Patent is hereby corrected as shown below:

In the Claims

In Column 9, Line 11, Claim 3, delete "switching unit a." and replace with --switching unit.--

Signed and Sealed this
Eighth Day of August, 2023

Katherine Kelly Vidal
*Director of the United States Patent and Trademark Office*